United States Patent
Cheng et al.

(10) Patent No.: US 12,424,485 B2
(45) Date of Patent: Sep. 23, 2025

(54) SEMICONDUCTOR STRUCTURE WITH AIR GAP AND METHOD FOR MANUFACTURING THE SAME

(71) Applicant: TAIWAN SEMICONDUCTOR MANUFACTURING COMPANY, LTD., Hsinchu (TW)

(72) Inventors: Kai-Fang Cheng, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 595 days.

(21) Appl. No.: 17/875,625

(22) Filed: Jul. 28, 2022

(65) Prior Publication Data

US 2024/0038586 A1 Feb. 1, 2024

(51) Int. Cl.
*H01L 21/768* (2006.01)
*H01L 23/532* (2006.01)
*H01L 23/535* (2006.01)

(52) U.S. Cl.
CPC .... *H01L 21/7682* (2013.01); *H01L 21/76805* (2013.01); *H01L 21/76846* (2013.01); *H01L 21/76849* (2013.01); *H01L 21/76895* (2013.01); *H01L 23/5329* (2013.01); *H01L 23/535* (2013.01)

(58) Field of Classification Search
CPC ........... H01L 21/7682; H01L 21/76846; H01L 23/535; H01L 23/53295; H01L 23/5222
See application file for complete search history.

(56) References Cited

U.S. PATENT DOCUMENTS

| | | | | |
|---|---|---|---|---|
| 9,368,362 | B2* | 6/2016 | Rha | H01L 21/76826 |
| 10,665,546 | B1* | 5/2020 | Lin | H01L 21/76826 |
| 11,183,421 | B2* | 11/2021 | Hsieh | H01L 23/53295 |
| 2009/0309230 | A1* | 12/2009 | Cui | H01L 23/53238 257/773 |
| 2012/0319279 | A1* | 12/2012 | Isobayashi | H01L 23/53238 438/653 |
| 2013/0323930 | A1* | 12/2013 | Chattopadhyay | H01L 21/76829 156/345.26 |
| 2017/0162431 | A1* | 6/2017 | Ahn | H01L 21/31116 |
| 2020/0185264 | A1* | 6/2020 | Lin | H01L 21/7682 |
| 2021/0193566 | A1* | 6/2021 | Lo | H01L 21/7682 |
| 2023/0068760 | A1* | 3/2023 | Huang | H01L 21/76877 |

* cited by examiner

*Primary Examiner* — Bac H Au

(74) *Attorney, Agent, or Firm* — Birch, Stewart, Kolasch & Birch, LLP

(57) ABSTRACT

A semiconductor structure includes a base structure, a plurality of electrically conductive features disposed on the base structure, and an isolation structure disposed on the base structure. The base structure includes a substrate. The electrically conductive features are spaced apart from each other. The isolation structure includes a first inter-metal dielectric feature extending horizontally to interconnect the electrically conductive features, a first air gap layer disposed in the isolation structure and around the electrically conductive features, and a first sustaining feature extending horizontally to interconnect the electrically conductive features and disposed between the first inter-metal dielectric feature and the first air gap layer. Methods for manufacturing the semiconductor structure are also disclosed.

20 Claims, 10 Drawing Sheets

SEMICONDUCTOR STRUCTURE WITH AIR GAP AND METHOD FOR MANUFACTURING THE SAME

BACKGROUND

With rapid development of semiconductor technology, the integration density of various electronic components, such as transistors, diodes, resistors, capacitors, etc., is being continuously improved by continual reduction in minimum feature sizes. As the feature sizes decrease, the distance between metal features is continually reduced, which increases the resulting parasitic capacitance between the metal features, thereby leading to higher power consumption and larger resistance-capacitance (RC) time delays for an integrated chip. Since air has a lowest k value (k=1), the use of air gaps in semiconductor devices to reduce RC time delays is well-known in the art of semiconductor fabrication. There is continuous demand to develop a structure and/or a method to incorporate air gaps into the semiconductor devices so as to isolate the metal features and to reduce line-to-line capacitance and the RC time delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
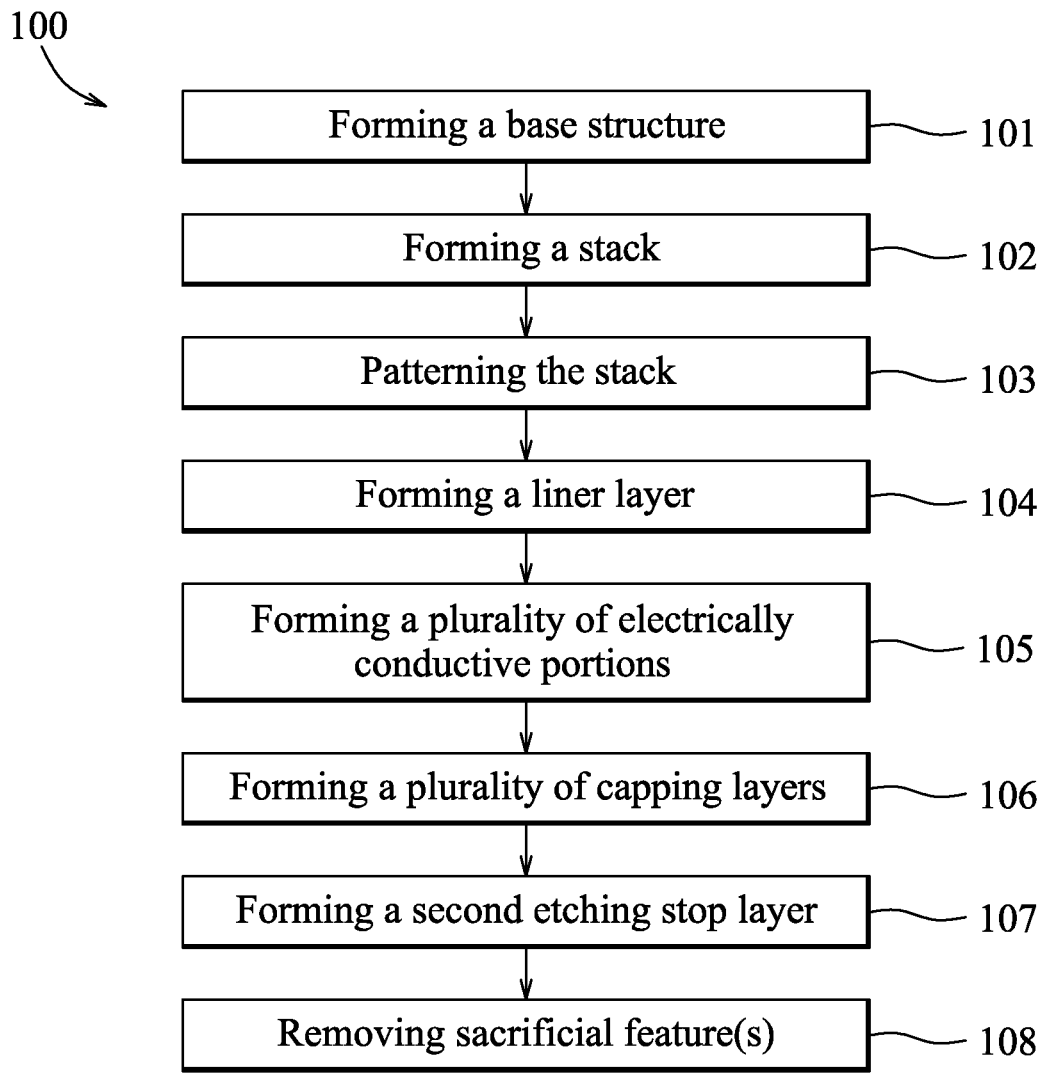
FIG. 1 is a flow diagram illustrating a method for manufacturing a semiconductor structure in accordance with some embodiments.
Figure 2:
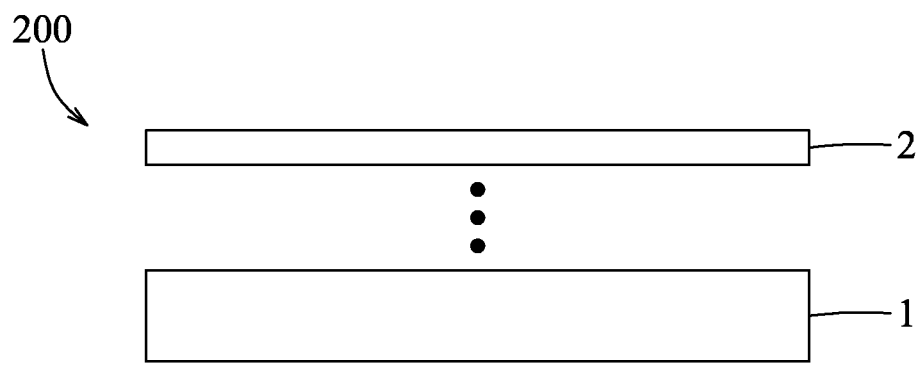
FIGS. 2 to 10 illustrate schematic views of intermediate stages of the method depicted in FIG. 1 in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor structure including an air gap and a method for manufacturing the same. The semiconductor structure has an improved heat dissipation capability, and the position, size and number of the air gap in the semiconductor structure can be controlled. The method for manufacturing the semiconductor structure may be integrated into a dual damascene process, a single damascene process, or other suitable back-end-of-line (BEOL) techniques.

FIG. 1 is a flow diagram illustrating a method 100 for manufacturing a semiconductor structure (for example, the semiconductor structures 400 shown in FIGS. 9, 12, 14, and 17) in accordance with some embodiments. FIGS. 2 to 10 illustrate schematic views of intermediate stages of the method 100 in accordance with some embodiments.

Referring to FIG. 1, the method 100 begins at step 101 where a base structure is formed. Referring to the example illustrated in FIG. 2, a base structure 200 is prepared.

The base structure 200 includes a substrate 1, a plurality of semiconductor devices (not shown) disposed on the substrate 1, and at least one interconnect layer including an interlayer dielectric (ILD) feature (not shown) in which electrically conductive elements (not shown, for example, metal contacts, metal lines and/or metal vias) are formed so as to permit the semiconductor devices in the base structure 200 to be electrically connected to external circuits through the electrically conductive elements. The method 100 described in the present disclosure may be a part of a BEOL process flow and may be controlled to at a temperature lower than, for example, about 450° C. so as to meet a temperature limitation for the BEOL process. For example, in some cases, when a deposition step or treating step in the BEOL process is performed at a temperature higher than about 450° C., the semiconductor devices formed in the front-end-of-line (FEOL) process may be undesirably damaged.

In some embodiments, the substrate 1 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the substrate 1 may be doped with p-type impurities or n-type impurities, or undoped. In addition, the substrate 1 may be a bulk silicon substrate, a silicon-on-insulator (SOI) substrate, or a germanium-on-insulator (GOI) substrate. Other suitable materials for the substrate 1 are within the contemplated scope of disclosure.

In some embodiments, the semiconductor devices may include active devices (for example, transistors, or the like), passive devices (for example, capacitors, resistors, or the like), decoders, amplifiers, and combinations thereof.

In some embodiments, each of the electrically conductive elements may be made of electrically conductive materials, such as tungsten (W), aluminum (Al), copper (Cu), ruthenium (Ru), molybdenum (Mo), alloys thereof, or combinations thereof, but is not limited thereto.

In some embodiments, the ILD feature may be made of a dielectric material, such as, but not limited to, silicon oxide, silicon nitride, silicon oxynitride, other suitable materials, or combinations thereof, and has an upper surface horizontally flush with that of the electrically conductive elements to facilitate subsequent formation of a BEOL structure thereon. The semiconductor devices, the electrically conductive elements and the ILD feature on the substrate 1 may be formed using processes known to those skilled in the art of semiconductor fabrication, and thus details thereof are omitted for the sake of brevity.

In some embodiments, the base structure 200 further includes a first etching stop layer 2 to cover the at least one interconnect layer. In some embodiments, suitable materials for forming the first etching stop layer 2 include silicon carbide (SiC), silicon nitride (SiN), silicon oxynitride (SiO$_x$N$_y$), silicon carbon nitride (SiC$_x$N$_y$), aluminum oxide (AlO$_x$), aluminum nitride (AlN$_x$), aluminum oxynitride (AlO$_x$N$_y$), aluminum oxycarbide (AlO$_x$C$_y$), boron nitride (B$_x$N$_y$), or boron carbon nitride (BC$_x$N$_y$). The materials for forming the first etching stop layer 2 may be doped with hafnium (Hf), zirconium (Zr), yttrium (Y), or combinations thereof, so that an etching rate of the first etching stop layer 2 may be lower, thereby increasing etching selectivity between the first etching stop layer 2 and material(s) to be subsequently formed thereon. In some embodiments, the first etching stop layer 2 may have a thickness ranging from about 60 to about 150 Å. In some embodiments, the first etching stop layer 2 may be formed by chemical vapor deposition (CVD), atomic layer deposition (ALD), or a spin coating process. In some embodiments, deposition of the first etching stop layer 2 may be performed at a temperature ranging from about 350° C. to about 425° C. Other suitable techniques and/or materials for forming the first etching stop layer 2 are within the contemplated scope of the present disclosure.

Referring to FIG. 1, the method 100 proceeds to step 102 where a stack is formed on the base structure. Referring to the example illustrated in FIG. 3, a stack 6 is formed on the base structure 200.

The stack 6 includes a first sacrificial layer 31, a first inter-metal dielectric (IMD) layer 51, and a first sustaining layer 41 interposed between the first sacrificial layer 31 and the first IMD layer 51. In some embodiments, the first sacrificial layer 31 and the first IMD layer 51 are respectively proximate to and distal from the substrate 1. In some embodiments, step 102 may include (i) forming the sacrificial layer 31 on the first etching stop layer 2, (ii) forming the first sustaining layer 41 on the sacrificial layer 31, and (iii) forming the first IMD layer 51 on the first sustaining layer 41.

In some embodiments, a total thickness of the stack 6 may vary according to specification of circuit design at different technology nodes.

In some embodiments, the first sacrificial layer 31 is made of a sacrificial polymer which has a glass-transition temperature ($T_g$) and a thermal decomposition temperature ($T_d$), where the $T_d$ value is higher than the $T_g$ value. Each of the $T_g$ value and the $T_d$ value is higher than a formation temperature of the first sustaining layer 41 and the first IM) layer 51. In some embodiments, the $T_g$ value is higher than about 200° C. In some embodiments, the $T_d$ value is higher than about 250° C. In some embodiments, the sacrificial polymer suitable for forming the first sacrificial layer 31 may be a hydrocarbon-based polymer, so that the sacrificial polymer may be removed (by for example, but not limited to, thermal decomposition) with less residues remaining in the semiconductor structure 400 (see FIGS. 9, 12, 14, and 17). In some embodiments, the first sacrificial layer 31 may be made of polyurea, polylactic acid, polycaprolactone, poly(ethylene oxide), polyacrylate, polyvinyl alcohol, or combinations thereof, but is not limited thereto.

In some embodiments, the first sacrificial layer 31 may be formed by a spin coating process at room temperature follow by a curing process at a temperature ranging from about 100° C. to about 250° C. Other suitable techniques and/or materials for forming the first sacrificial layer 31 are within the contemplated scope of the present disclosure.

In some embodiments, the first sustaining layer 41 is made of a silicon carbon nitride-based (SiCN-based) material, and has a dielectric constant (k) ranging from about 2.5 to about 4.5. Furthermore, at the same k value, the SiCN-based material for forming the first sustaining layer 41 has a hardness about two to four times greater than that of silicon oxycarbide (SiO$_x$C$_y$). In some embodiments, the first sustaining layer 41 may have a hardness ranging from about 5 GPa to about 30 GPa. Additionally, the SiCN-based material for forming the first sustaining layer 41 has a thermal conductivity about five to ten times greater than that of silicon oxycarbide (SiO$_x$C$_y$). In some embodiments, the first sustaining layer 41 has a thermal conductivity ranging from about 0.5 W/Mk to about 3 W/Mk. In some embodiments, the SiCN-based material for forming the first sustaining layer 41 includes silicon elements in an atomic concentration ranging from about 10% to about 35%, carbon elements in an atomic concentration ranging from about 20% to about 50%, and nitride elements in an atomic concentration ranging from about 20% to about 40%. In some embodiments, the SiCN-based material for forming the first sustaining layer 41 further includes oxygen elements in an atomic concentration ranging from about 6% to about 8%. It is noted that the higher the content of the nitride elements in the SiCN-based material, the higher the k value of the SiCN-based material is, and that the higher the content of the carbon elements in the SiCN-based material, the lower the k value of the SiCN-based material is. Furthermore, for the SiCN-based material, hardness thereof is positively correlated to the k value thereof.

In some embodiments, the first sustaining layer 41 may have thickness ranging from about 30 Å to about 60 Å.

In some embodiments, the first sustaining layer 41 may be formed by chemical vapor deposition (CVD), atomic layer deposition (ALD), or other suitable deposition techniques. In some embodiments, the first sustaining layer 41 may be formed from a silicon-containing precursor [e.g., tetramethylsilane (Si(CH$_3$)$_4$) or silane (SiH$_4$)], a carbon-containing precursor [e.g., tetramethylsilane (Si(CH$_3$)$_4$) or ethylene (C$_2$H$_4$)], and a nitride-containing precursor [e.g., ammonia (NH$_3$)]. In some embodiments, the first sustaining layer 41 may be formed at a temperature ranging from about 250° C. to about 350° C. The properties of the first sustaining layer 41, such as material composition, hardness and dielectric constant (k), may be tuned by controlling deposition parameters (e.g., temperature, pressure, a ratio of the abovementioned precursors for forming the first sustaining layer 41, etc.) for forming the first sustaining layer 41. In some embodiments, the first sustaining layer 41 may be subjected to an additional annealing process and/or an ultraviolet (UV) treatment to improve mechanical strength thereof. Other suitable techniques and/or materials for forming the first sustaining layer 41 are within the contemplated scope of the present disclosure.

In some embodiments, the first IMD layer 51 is made of a silicon carbon nitride-based (SiCN-based) material that is similar to that for forming the first sustaining layer 41, and thus details thereof are omitted for the sake of brevity. In some embodiments, the first IMD layer 51 may be made of a SiCN-based material that is the same as that of the first sustaining layer 41. When the SiCN-based material for forming the first IMD layer 51 and the first sustaining layer 41 has a higher k value, a required total thickness of the first IMD layer 51 and the first sustaining layer 41 may be reduced. In some embodiments, the first IMD layer 51 and the first sustaining layer 41 are made of SiCN-based materials that are different from each other, and the first IMD layer 51 has a k value lower than that of the first sustaining layer 41. For example, the first IMD layer 51 has a k value ranging from about 2.5 to about 3.5. The first sustaining layer 41 has a k value ranging from about 3.5 to about 4.5. In this case, the first IMD layer 51 may have a thickness greater than that of the first sustaining layer 41, so that the first IMD layer 51 and the first sustaining layer 41 cooperatively have a relatively low k value, and can provide a sufficient mechanical strength for the stack 6 during a patterning process to be subsequently performed. For example, the first IMD layer 51 may have a thickness about five times to ten times greater than that of the first sustaining layer 41.

In some embodiments, the first IMD layer 51 may be formed in a manner similar to that for forming the first sustaining layer 41, but parameter(s) of the deposition process (e.g., a ratio of the silicon-containing precursor, the carbon-containing precursor, and the nitride-containing precursor) is required to be tuned so as to obtain the first IMD layer 51 with a desired material composition.

Referring to FIG. 1, the method 100 proceeds to step 103 where the stack is patterned to form a plurality of recesses penetrating through the stack and spaced apart from each other. Referring to the example illustrated in FIG. 4, the stack 6 shown in FIG. 3 is patterned to form a plurality of recesses 7 penetrating through the stack 6 and spaced apart from each other.

In some embodiments, a dimension (e.g., depth and width) of each of the recesses 7 and a distance between two adjacent ones of the recesses 7 may vary according to specification of circuit design at different technology nodes.

In some embodiments, the first etching stop layer 2 of the base structure 200 is exposed from the recesses 7. In some embodiments, the stack 6 may be patterned by a dry etching process, a wet etching etching process, or a combination thereof. Other suitable techniques for patterning the stack 6 are within the contemplated scope of the present disclosure.

Figure 3:
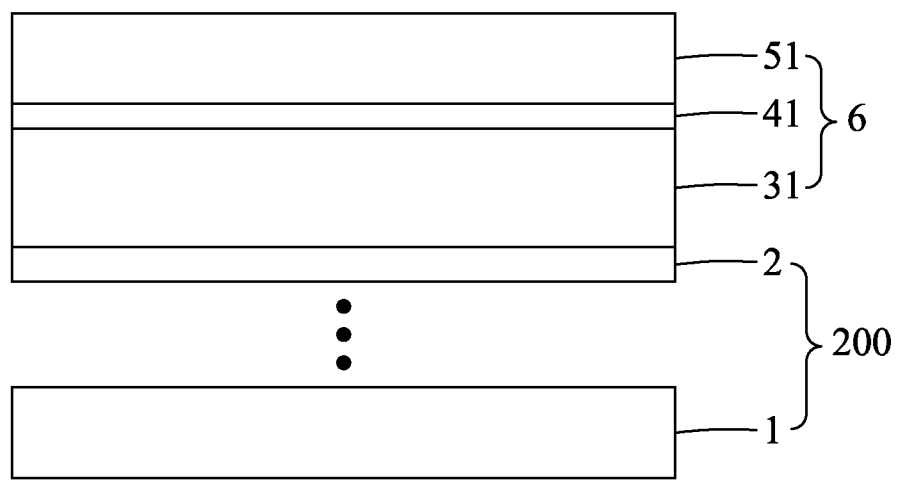
Figure 4:
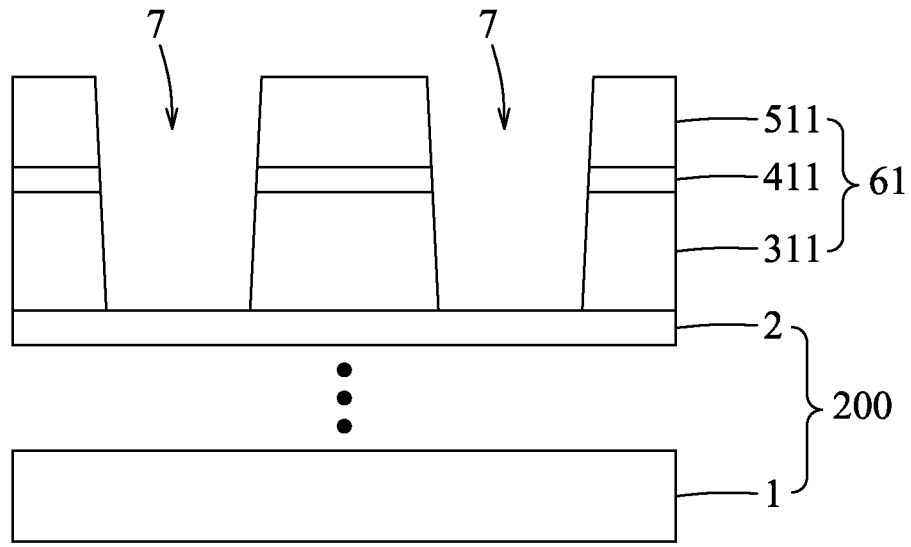
Figure 5:
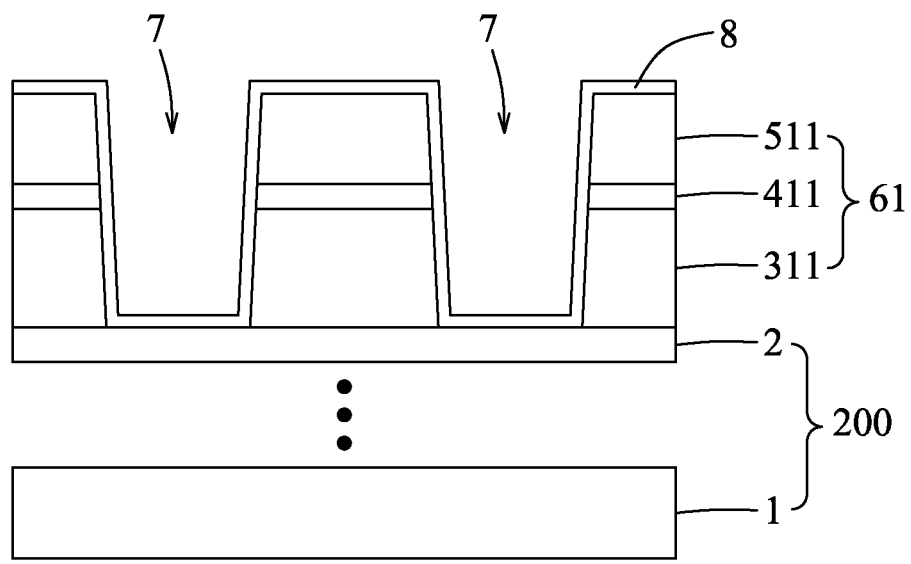
Figure 6:
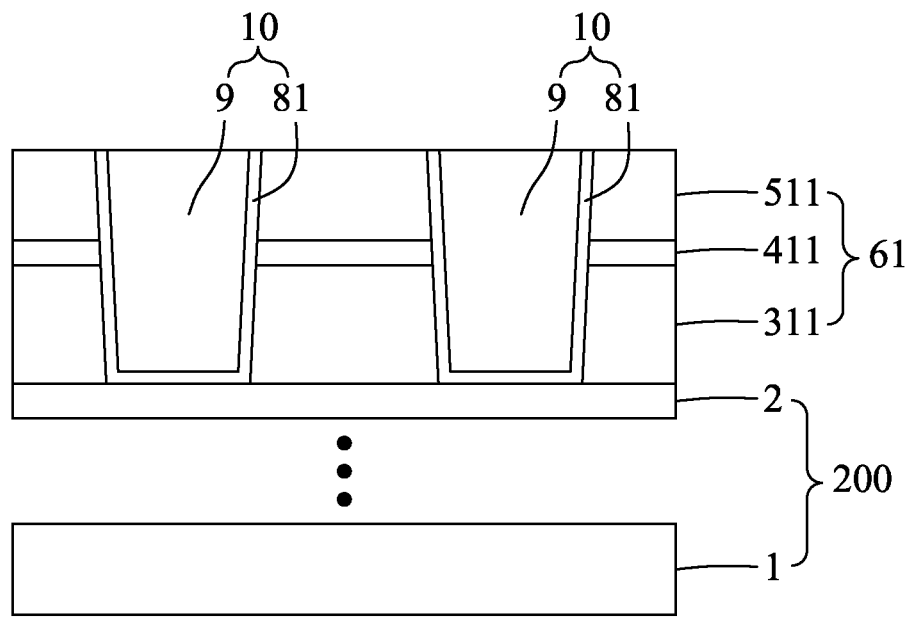

After step 103, the first sacrificial layer 31, the first sustaining layer 41 and the first IMD layer 51 of the stack 6 shown in FIG. 3 are respectively patterned into a first sacrificial feature 311, a first sustaining feature 411, and a first IMD feature 511 of a patterned stack 61 shown in FIG. 4.

Referring to FIG. 1, the method 100 proceeds to step 104 where a liner layer is formed. Referring to the example illustrated in FIG. 5, a liner layer 8 is formed on the structure as shown in FIG. 4.

In some embodiments, the liner layer 8 may be made of tantalum (Ta), tantalum nitride (Ta), titanium (Ti), titanium nitride (TiN), or combinations thereof, but is not limited thereto. In some other embodiments, the liner layer S may be made of a silicon carbon nitride-based (SiCN-based) material that is similar to that for forming the first sustaining layer 41, and thus details thereof are omitted for the sake of brevity. The concentration of each of the silicon, carbon and nitride elements in the SiCN-based material for forming the liner layer 8 may be the same as or different from that for forming the first sustaining layer 41 and/or the first IMD layer 51. In some embodiments, the liner layer 8 has a thickness ranging from about 40 Å to about 60 Å.

In some embodiments, the liner layer 8 may be conformally formed in a manner similar to that for forming the first sustaining layer 41, but parameter(s) of the deposition process (e.g., a ratio of the silicon-containing precursor, the carbon-containing precursor, and the nitride-containing precursor) is required to be tuned so as to obtain the liner layer 8 with a desired material composition. In some other embodiments, step 104 may be omitted.

Referring to FIG. 1, the method 100 proceeds to step 105 where a plurality of electrically conductive portions are respectively formed in the recesses. Referring to the examples illustrated in FIGS. 5 and 6, a plurality of electrically conductive portions 9 are respectively formed in the recesses 7.

In some embodiments, step 105 includes (i) depositing an electrically conductive material for forming the electrically conductive features 9 to fill the recesses 7 obtained after step 104 (see FIG. 5), and (ii) performing a planarization process, for example, but not limited to, CMP or other suitable processes, to expose the patterned stack 61. In some embodiments, suitable materials for forming the electrically conductive portions 9 include copper (Cu), nickel (Ni), cobalt (Co), ruthenium (Ru), iridium (Ir), aluminum (Al), platinum (Pt), palladium (Pd), golden (Au), silver (Ag), osmium (Os), tungsten (W), molybdenum (Mo), alloys thereof, and combinations thereof. Other suitable materials for forming the electrically conductive portions 9 are within the contemplated scope of the present disclosure. In some embodiments, the electrically conductive material may be formed by ALD, CVD, physical vapor deposition (PVD), electroless deposition (ELD), electrochemical plating (ECP), or combinations thereof. In some embodiments, the electrically conductive material may be formed at a temperature ranging from about 250° C. to about 450° C. Other suitable techniques for forming the electrically conductive portions 9 are within the contemplated scope of the present disclosure.

After step 105, the liner layer 8 is formed into a plurality of liner portions 81 each of which is disposed between an inner surface of one of the recesses 7 and a corresponding one of the electrically conductive portions 9. In some embodiments, after step 105, a plurality of electrically conductive features 10, each including one of the liner portions 81 and the corresponding electrically conductive portion 9, are formed on the base structure 200 and spaced apart from each other. Each of the liner portions 81 is used to block oxygen gas and/or moisture in the ambient atmosphere so as to prevent the corresponding electrically conductive portion 9 from being oxidized.

Referring to FIG. 1, the method 100 proceeds to step 106 where a plurality of capping layers are respectively formed on the electrically conductive portions. Referring to the example illustrated in FIG. 7, a. plurality of capping layers 11 are respectively formed on the electrically conductive portions 9.

Each of the capping layers 11 is used to prevent the metal elements in a corresponding one of the electrically conductive portions 9 from diffusing outwardly.

In some embodiments, the capping layers 11 may include metal elements (for example, but not limited to, Co), graphene, silicon nitride, or combinations thereof. Other suitable materials for forming the capping layer 11 are within the contemplated scope of the present disclosure. In some embodiments, each of the capping layers 11 has a thickness ranging from about 20 Å to about 25 Å.

In some embodiments, the capping layers 11 may be formed by a selective deposition process so as to permit the capping layers 11 to be respectively and selectively deposited on the electrically conducive portions 9. In some embodiments, when the liner portions 81 are made of metal(s) (e.g., Ta, and/or Ti), the capping layers 11 may be also selectively deposited on the liner portions 81, respectively. In some embodiments, for example, when each of the capping layers 11 is made of silicon nitride and each of the liner portions 81 is made of a SiCN-based material, the silicon nitride may be selectively deposited on the electrically conductive portions 9 by thermal ALD using a silicon-containing precursor (e.g., $Si(CH_3)_4$) and a nitride-containing precursor (e.g., $NH_3$) at a deposition temperature ranging from about 200° C. to about 300° C. In some embodiments, for example, when each of the capping layers 11 is made of graphene, the graphene may be formed by CVD, or vaper-phase epitaxy (VPE) at a deposition temperature ranging from about 300° C. to about 450° C., but is not limited thereto. Other suitable techniques for forming the capping layers 11 are within the contemplated scope of the present disclosure.

Figure 7:
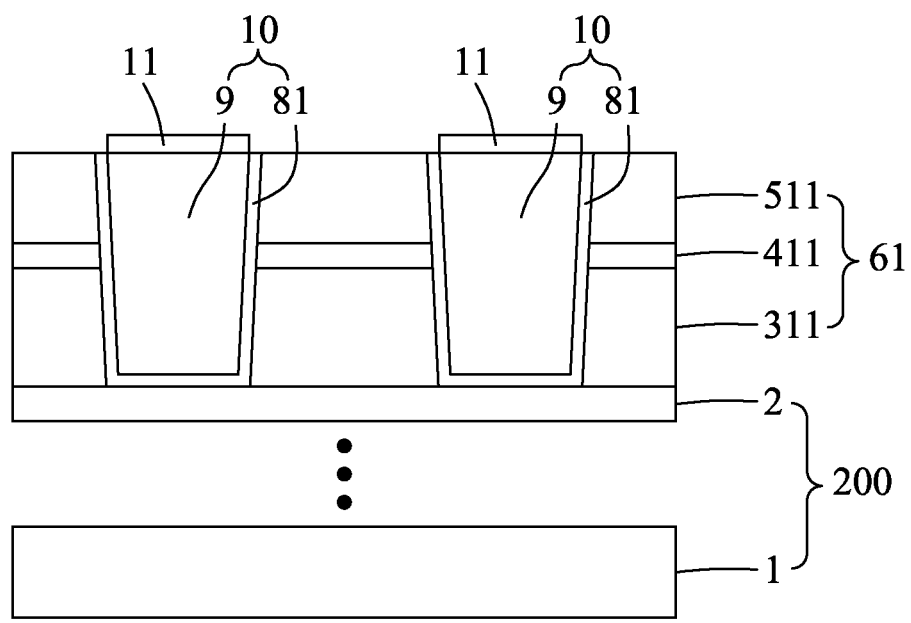
Figure 8:
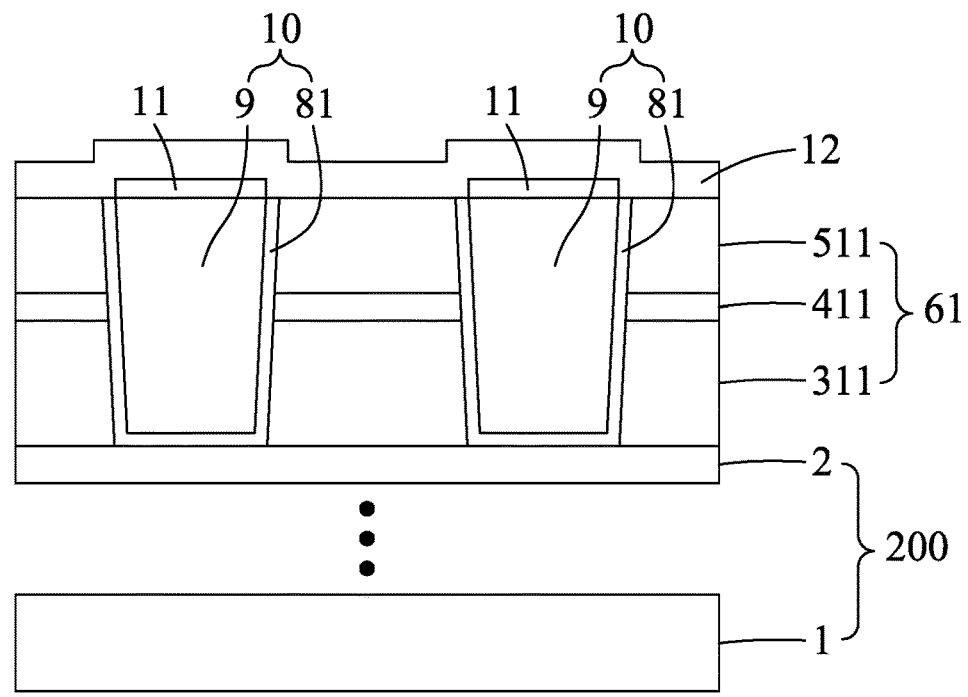

Referring to FIG. 1, the method 100 proceeds to step 107 where a second etching stop layer is formed. Referring to the example illustrated in FIG. 8, a second etching stop layer 12 is formed on the structure as shown in FIG. 7 by CVD, ALD, or a spin coating process.

In some embodiments, the materials, range of thickness, and technique for forming the second etching stop layer 12 are similar to those for the first etching stop layer 2, and thus details thereof are omitted for the sake of brevity.

Referring to FIG. 1, the method 100 proceeds to step 108 where sacrificial feature(s) is (are) removed. Referring to the examples illustrated in FIGS. 8 and 9, the first sacrificial feature 311 are removed to form a first air gap layer 13, and the semiconductor structure 400 is thus formed.

The first air gap layer 13 has a thickness (T) which mainly depends on that of the first sacrificial feature 311 (or the first sacrificial layer 31). In some embodiments, the first air gap layer 13 may include a plurality of first air gap portions 131. In some embodiments, at least one of the first air gap portions 131 is present between two adjacent ones of the electrically conductive portions 9. In some embodiments, any two adjacent ones of the first air gap portions 131 may be merged or without being merged.

In some embodiments, the sacrificial feature(s) may be removed by a thermal treatment, an ultraviolet treatment, or a combination thereof so as to permit the first sacrificial feature 311 to be decomposed, vaporized, and degas through the first sustaining feature 411, the first IMD feature 511 and the second etching stop layer 12. In some embodiments, decomposition of the first sacrificial feature 311 is executed at a temperature ranging from about 250° C. to about 350° C. Process parameters (for example, but not limited to, temperature, time period, etc.) for decomposition of the first sacrificial feature 311 may be adjusted according to selection of polymers for forming the first sacrificial feature 311 and in consideration of thermal budget of the semiconductor structure 400 such that less residue remains in the semiconductor structure 400.

Figure 9:
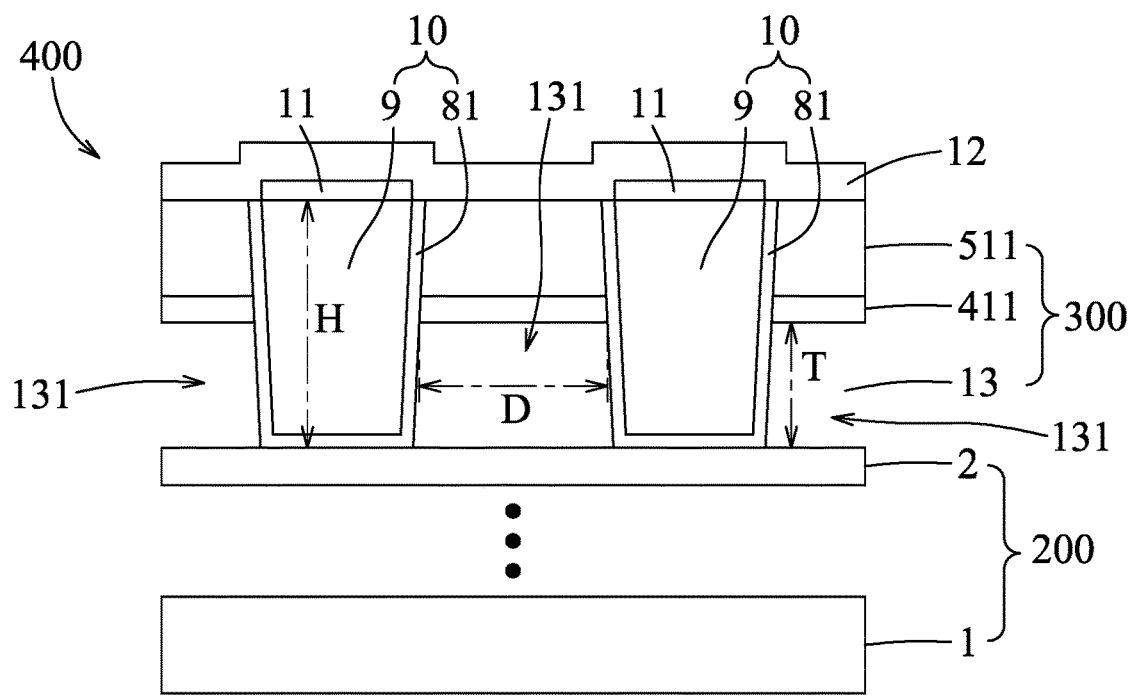

After step 108, the first IMD feature 511 extends horizontally to interconnect the electrically conductive features 10, the first air gap layer 13 is formed around the electrically conductive features 10, and the first sustaining feature 411 extends horizontally to interconnect the electrically conductive features 10 and disposed between the first IMD feature 511 and the first air gap layer 13. The first air gap layer 13, the first sustaining feature 411 and the first IMD feature 511 cooperatively form an isolation structure 300. In some embodiments, as shown in FIG. 9, the first air gap layer 13 and the first IMD feature 511 are respectively proximate to and distal from the substrate 1. In some embodiments, each of the electrically conductive features 10 has a height (H), and two adjacent ones of the electrically conductive features 10 are spaced apart by a distance (D) at a half of the height (½H). A ratio of the height (H) to the distance (D) may range from about 1:0.5 to about 1:3.

It can be noted that the first air gap layer 13 is present between two adjacent ones of the electrically conductive portions 9, and that the first air gap layer 13 may be uniformly controlled at a predetermined level. For example, as shown in FIG. 9, the first air gap layer 13 is confined between an upper surface of the first etching stop layer 2 and a lower surface of the first sustaining feature 411. Therefore, a parasitic capacitance generated between the two adjacent ones of the electrically conductive portions 9 may be effectively reduced. Furthermore, since each of the first sustaining feature 411 and the first IMD feature 511 is made of a SiCN-based material with a relatively high hardness, and since the position of the first air gap layer 13 is well controlled, the isolation structure 300 may have a sufficient mechanical strength to avoid cracking of the semiconductor structure 400 caused by an external physical force. Additionally, since the first sustaining feature 411, the first IMD feature 511, the liner portions 81, and/or the second etching stop layer 12 may be made of a SiCN-based material with a relatively high thermal conductivity, heat generated during operation of the semiconductor structure 400 can be dissipated by the SiCN-based materials disposed around the electrically conductive portions 9, thereby increasing design window of an operating current.

In some embodiments, the first sustaining feature 411 has a dielectric constant (k) larger than that of the first IMD feature 511, and has a thickness less than that of the first IMD feature 511. In this case, the first sustaining feature 411 having a higher dielectric constant (k) can provide the semiconductor structure 400 with a sufficient mechanical strength for retaining the first air gap layer 13 therein. The first IMD feature 511 having a greater thickness can ensure that the isolation structure 300 has a relatively low dielectric constant (k) value.

Figure 10:
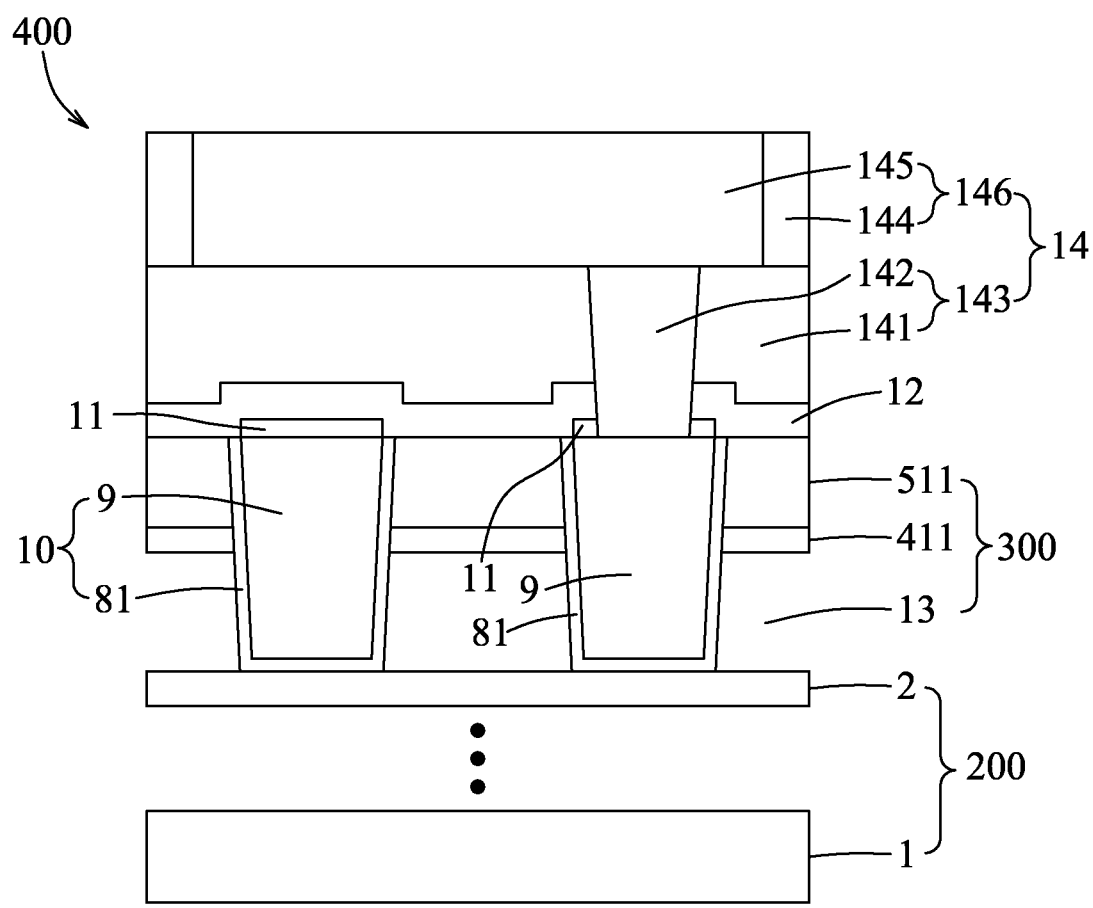

In some embodiments, as shown in FIG. 10, the semiconductor structure 400 may further include an interconnect structure 14 which is formed on the structure as shown in FIG. 9 and which includes a plurality of interconnect features 143, 146 (two of which are shown in FIG. 10). Each of the interconnect features 143, 146 includes an insulating portion 141, 143, and a metal interconnecting layer 142, 144 formed in the insulating portion 141, 143. In practice, the number and configuration of the interconnect features 143, 146 can be varied according to the layout design of the semiconductor structure 400.

In some embodiments, according to the layout design of the semiconductor structure 400, the metal interconnecting layer 142 may penetrate through the second etching stop layer 12 and the capping layer 11 to be electrically interconnected to a corresponding one of the electrically conductive portions 9, as shown in FIG. 10.

In some embodiments, the interconnect features 143, 146 of the interconnect structure 14 shown in FIG. 10 may be separately formed as two distinct structures using two single damascene processes, or may be simultaneously formed as a single structure using a dual damascene process. Other suitable processes for forming the interconnect structure 14 are within the contemplated scope of the present disclosure.

In some embodiments, some steps in the method 100 may be modified, replaced, or eliminated without departure from the spirit and scope of the present disclosure. In the following description, variants of the semiconductor structure 400 are shown to demonstrate that the position and the number of the air gap layer(s) are able to be controlled by different configurations of the stack 6. Similar numerals from the above-mentioned embodiments have been used where appropriate, with some construction differences being indicated with different numerals.

Figure 11:
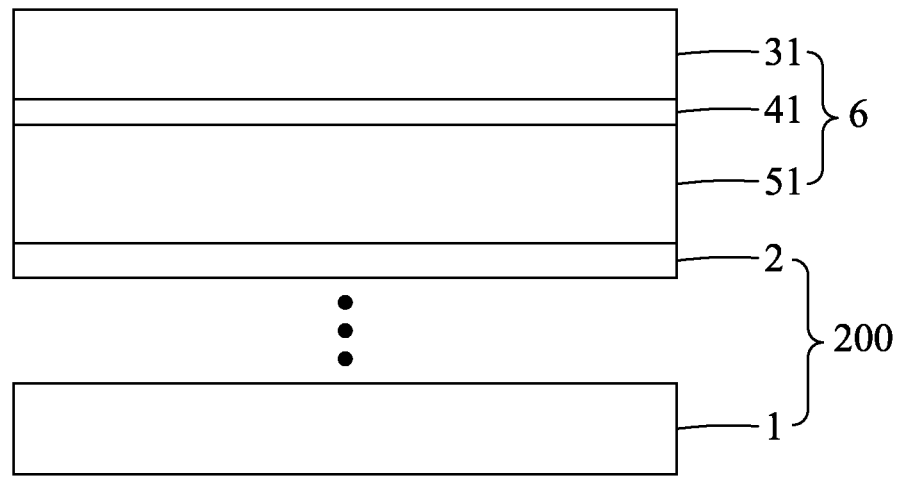
FIG. 11 is a schematic sectional view illustrating another stack in accordance with some embodiments.

FIG. 11 is a schematic sectional view illustrating another stack 6 obtained in step 102 of the method 100 in accordance with some embodiments.

The stack 6 shown in FIG. 11 may have a structure similar to that shown in FIG. 3 except that the first sacrificial layer 31, the first sustaining layer 41, and the first inter-metal dielectric (IMD) layer 51 are reversely and sequentially stacked on the base structure 200 in accordance with some embodiments. That is, the first sacrificial layer 31 and the first IMD layer 51 are respectively distal from and proximate to the substrate 1.

For forming the stack 6 shown in FIG. 11, step 102 may include (i) forming the first IMD layer 51 on the first etching stop layer 2, (ii) forming the first sustaining layer 41 on the first IMD layer 51, and (iii) forming the sacrificial layer 31 on the first sustaining layer 41.

Figure 12:
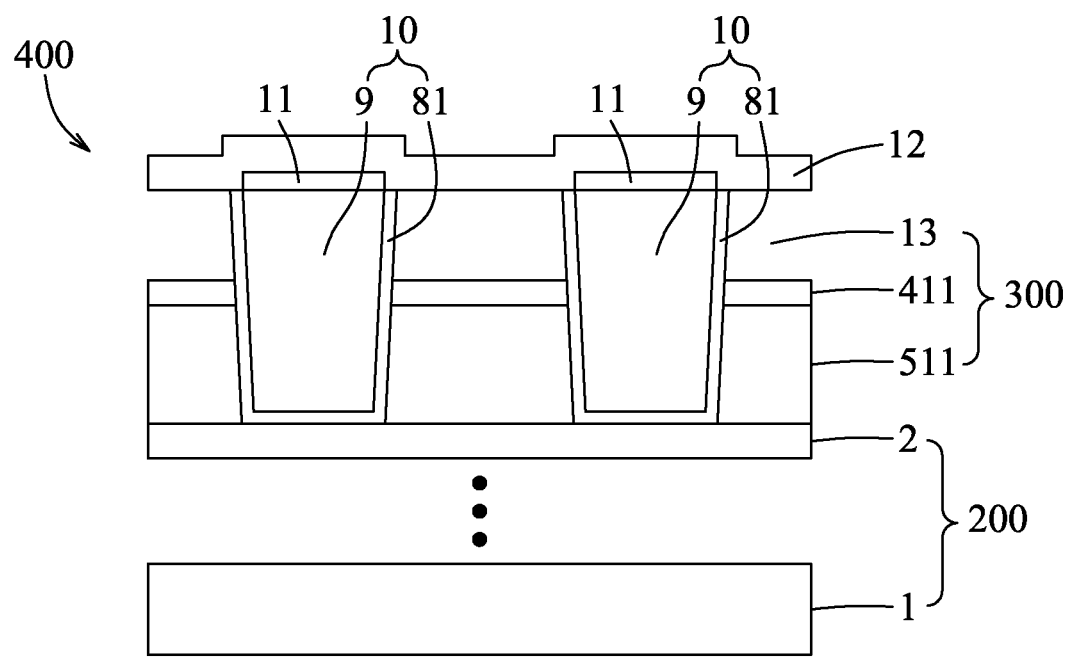
FIG. 12 is a schematic sectional view illustrating another semiconductor structure in accordance with some embodiments.

FIG. 12 is a schematic sectional view illustrating another semiconductor structure 400 in accordance with some embodiments.

The semiconductor structure 400 may be formed from the stack 6 shown in FIG. 11. It can be found in FIG. 12 that after removing the sacrificial feature(s) (i.e., step 108), the first air gap layer 13 and the first IMD feature 511 are respectively distal from and proximate to the substrate 1. That is, the first air gap layer 13 is formed between the first sustaining feature 411 and the second etching stop layer 12, and may be controlled to be present at an upper portion of the isolation structure 300.

Figure 13:
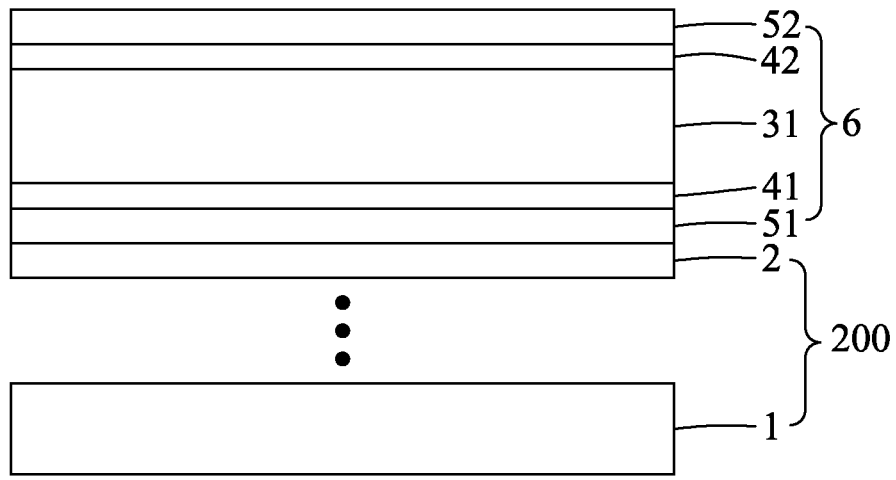
FIG. 13 is a schematic sectional view illustrating yet another stack in accordance with some embodiments.

FIG. 13 is a schematic sectional view illustrating yet another stack 6 in accordance with some embodiments.

The stack 6 shown in FIG. 13 may have a structure similar to that shown in FIG. 11 except that the stack 6 further includes a second sustaining layer 42 and a second IMD layer 52 sequentially disposed on the first sacrificial layer 31 opposite to the first sustaining layer 41. That is, the second sustaining layer 42 and the second IMD layer 52 are respectively proximate to and distal from the first sustaining layer 41.

In this case, step 102 for forming the stack 6 shown in FIG. 13 may be similar to that describe above with reference to FIG. 11, but further includes (iv) forming the second sustaining layer 42 on the first sacrificial layer 31, and (v) forming the second IMD layer 52 on the second sustaining layer 42. Since suitable techniques and/or materials for forming the second sustaining layer 42 are similar to those for forming the first sustaining layer 41 as described above with reference to FIG. 3, and since suitable techniques and/or materials for forming the second IMD layer 52 are similar to those for forming the first IMD layer 51 as described above with reference to FIG. 3, the details thereof are omitted for the sake of brevity.

In some embodiments, the second sustaining layer 42 and the second IM-D layer 52 may have thickness and dielectric constant (k) relationships similar to those between the first sustaining layer 41 and the first IMD layer 51. In this case, the second IMD layer 52 may have a k value lower than that of the second sustaining layer 42, and the second IMD layer 52 may have a thickness greater than that of the second sustaining layer 42.

For example, the first IMD layer 51 has a k value ranging from about 2.5 to about 3.5, and the first sustaining layer 41 has a k value ranging from about 3.5 to about 4.5. The second IMD layer 52 may have a thickness about five times to ten times greater than that of the second sustaining layer 42.

Figure 14:
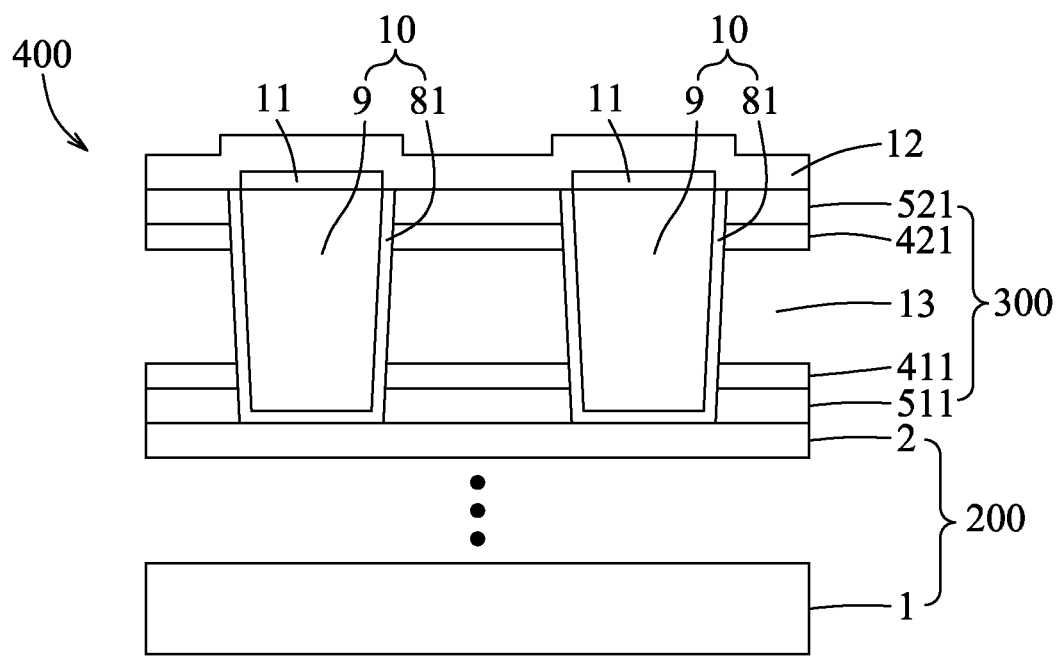
FIG. 14 is a schematic sectional view illustrating yet another semiconductor structure in accordance with some embodiments.

Please note that in step 103 for patterning the stack 6 shown in FIG. 13, in addition to patterning of the first IMD layer 51, the first sustaining layer 41 and the sacrificial layer 31, the second sustaining layer 42 and the second IMD layer 52 are also respectively patterned into a second sustaining feature 421 and a second IMID feature 521 (see FIG. 14).

FIG. 14 is a schematic sectional view illustrating yet another semiconductor structure 400 in accordance with some embodiments.

The semiconductor structure 400 may be formed from the stack 6 shown in FIG. 13. It can be found in FIG. 14 that after removing the sacrificial feature(s) (i.e., step 108), the isolation structure 300 further includes the second sustaining feature 421 and the second IMD feature 521 which are sequentially disposed on the first air gap layer 13 opposite to the first sustaining feature 411, and which are respectively proximate to and distal from the first sustaining feature 411. Each of the second sustaining feature 421 and the second IMD feature 521 extends horizontally to interconnect the electrically conductive features 10. The second sustaining feature 421 is disposed between the second IMD feature 521 and the first air gap layer 13.

In this case, the first air gap layer 13 may be disposed between and supported by the first sustaining feature 411 and the second sustaining feature 421. Furthermore, the position and the size of the first air gap 13 may be controlled by adjusting a thickness of each of the first and second sustaining features 411, 421, and the first and second IMD features 511, 521.

Figure 15:
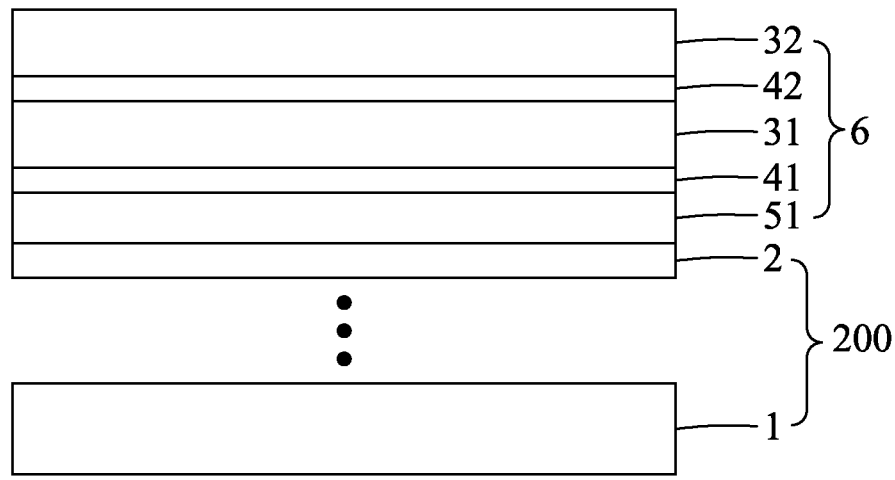
FIG. 15 is a schematic sectional view illustrating a still yet another stack in accordance with some embodiments.

FIG. 15 is a schematic sectional view illustrating a still yet another stack 6 in accordance with some embodiments.

The stack 6 shown in FIG. 15 may have a structure similar to that shown in FIG. 11, but further includes the second sustaining layer 42 and a second sacrificial layer 32 sequentially disposed on the first sacrificial layer 31 opposite to the first sustaining layer 41. That is, the second sustaining layer 42 and the second sacrificial layer 32 are respectively proximate to and distal from the first sustaining layer 41.

In this case, step 102 for forming the stack 6 shown in FIG. 15 may be similar to that describe above with reference to FIG. 11, but further includes (iv) forming the second sustaining layer 42 on the first sacrificial layer 31, and (v) forming the second sacrificial layer 32 on the second sustaining layer 42. Since suitable techniques and/or materials for forming the second sustaining layer 42 are similar to those for forming the first sustaining layer 41 as described above with reference to FIG. 3, and since suitable techniques and/or materials for forming the second sacrificial layer 32 are similar to those for forming the first sacrificial layer 31 as described above with reference to FIG. 3, the details thereof are omitted for the sake of brevity. In some embodiments, the second sustaining layer 42 may have a thickness ranging from about 30 Å to about 60 Å.

Figure 16:
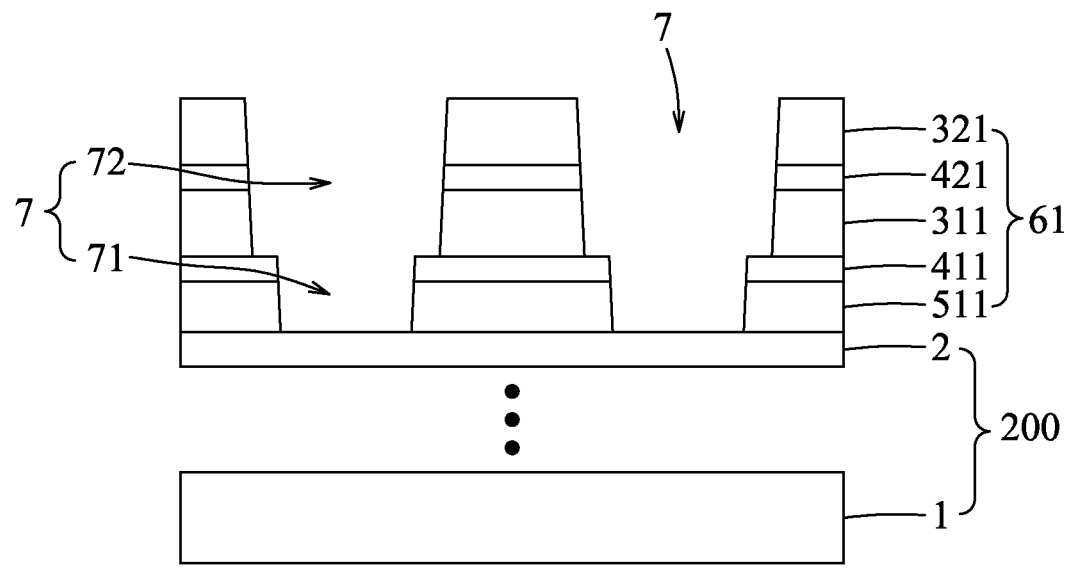
FIG. 16 is a schematic sectional view illustrating a patterned stack in accordance with some embodiments.

FIG. 16 is a schematic sectional view illustrating a patterned stack 61 in accordance with some embodiments.

The patterned stack 61 may be formed from the stack 6 shown in FIG. 15. Please note that in step 103 for patterning the stack 6 shown in FIG. 15, in addition to patterning of the first IMD layer 51, the first sustaining layer 41 and the sacrificial layer 31, the second sustaining layer 42 and the second sacrificial layer 32 are also respectively patterned into the second sustaining feature 421 and a second sacrificial feature 321. In some embodiments, each of the recesses 7 may have a first recess portion 71 located in the first IMD feature 511 and the first sustaining feature 411, and a second recess portion 72 located in the first sacrificial feature 311, the second sustaining feature 421 and the second sacrificial feature 321. The second recess portion 72 has a dimension larger than that of the first recess portion 71. In this case, patterning the stack 6 shown in FIG. 15 may include two or more etching processes (for example, but not limited to, a dry etching process, a wet etching process, or a combination thereof) to form the first recess portion 71 (i.e., a via opening) and the second recess portion 72 (i.e., a trench) of each of the recesses 7.

Figure 17:
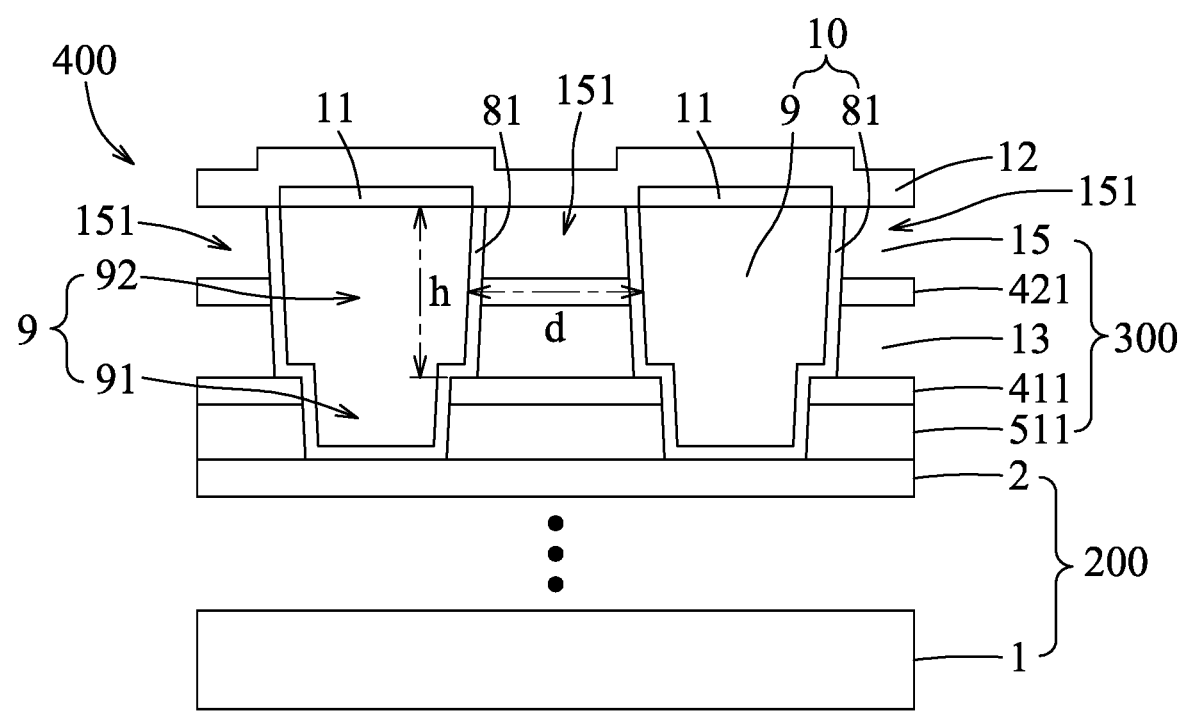
FIG. 17 is a schematic sectional view illustrating a still yet another semiconductor structure in accordance with some embodiments.

FIG. 17 is a schematic sectional view illustrating a still yet another semiconductor structure 400 in accordance with some embodiments.

The semiconductor structure 400 may be formed from the structure shown in FIG. 16. It can be found in FIG. 17 that after removing the first and second sacrificial features 311, 321 shown in FIG. 16 in step 108, the first air gap layer 13 and a second air gap layer 15 are obtained in the isolation structure 300. In some embodiments, the second sacrificial feature 321 and the first sacrificial feature 311 may be removed at the same time and in a manner similar to that for removing the first sacrificial feature 311 as described above with reference to FIG. 9. The second air gap layer 15 has a thickness which mainly depends on that of the second sacrificial feature 321 (or the second sacrificial layer 32). In some embodiments, the second air gap layer 15 may include a plurality of second air gap portions 151. In some embodiments, at least one of the second air gap portions 151 is present between two adjacent ones of the electrically conductive portions 9. In some embodiments, any two adjacent ones of the second air gap portions 151 may be merged or without being merged.

Furthermore, the semiconductor structure 400 shown in FIG. 17 may have a structure similar to that shown in FIG. 12 but the isolation structure 300 shown in FIG. 17 further includes the second sustaining feature 421 and the second air gap layer 15 which are sequentially disposed on the first air gap layer 13 opposite to the first sustaining feature 411. The second sustaining feature 421 and the second air gap layer 15 are respectively proximate to and distal from the first sustaining feature 411. The second sustaining feature 421 extends horizontally to interconnect the electrically conductive features 10, and is disposed between the first and second air gap layers 13, 15. The second air gap layer 15 is disposed between the second sustaining feature 421 and the second etch stop layer 12 and around the electrically conductive features 10.

Each of the electrically conductive portions 9 shown in FIG. 17 may include a first conductive part 91 (i.e., a via) formed in the first recess portion 71 of a corresponding one of the recesses 7 (see FIG. 16), and a second conductive part 92 (i.e., a metal line) formed in the second recess portion 72 of the corresponding recess 7. In some embodiments, each of the second conductive part 92 has a height (h), and two adjacent ones of the second conductive parts 92 are spaced apart by a distance (d) at a half of the height (1½h). A ratio of the height (h) to the distance (d) may range from about 1:0.5 to about 1:3. Since the first and second conductive parts 91, 92 (i.e., the via and the metal line) may be formed at the same time, such procedure may be referred to as a dual damascene process.

In this case, the first and second air gaps 13, 15 may be present between two adjacent one of the metal lines, and hence, a parasitic capacitance generated therebetween may be effectively reduced. Furthermore, the first and second air gap layers 13, 15 may be supported by the first and second sustaining features 411, 421.

In this disclosure, with the provision of the SiCN-based material which may be used for forming the sustaining layer/feature, the IMD layer/feature, and/or the liner layer/portions, the semiconductor structure including at least one air gap has several advantages. For example, heat generated during operation of the semiconductor structure can be effectively dissipated by the SiCN-based materials without being trapped in the isolation structure, thereby increasing design window of an operating current. Furthermore, by controlling the thickness and the composition of the SiCN-based material of each of the sustaining layer and the IMD layer, the isolation structure may have a sufficient mechanical strength and a relatively low dielectric constant (k), thereby avoiding cracking of the semiconductor structure and reducing RC time delay of the semiconductor structure. Additionally, the position and the size of the air gap in the semiconductor structure may be controlled by adjusting configuration of the stack such that the air gap has a uniform thickness and such that the entire air gap is located between two adjacent ones of metal lines in the semiconductor structure, thereby avoiding cracking of the semiconductor structure initiated from a thick air gap, and effectively reducing RC time delay of the semiconductor structure.

In accordance with some embodiments of the present disclosure, a method for manufacturing a semiconductor structure includes: forming a stack over a substrate, the stack including a sacrificial layer, an inter-metal dielectric layer, and a sustaining layer formed between the sacrificial layer and the inter-metal dielectric layer; patterning the stack to form a plurality of recesses spaced apart from each other, each of the recesses penetrating through the stack such that the sacrificial layer, the sustaining layer and the inter-metal dielectric layer are respectively patterned into a sacrificial feature, a sustaining feature and an inter-metal dielectric feature; forming a plurality of electrically conductive portions respectively in the recesses; and removing the sacrificial feature to form an air gap layer in the patterned stack.

In accordance with some embodiments of the present disclosure, each of the sustaining layer and the inter-metal dielectric layer is independently made of a silicon carbon nitride-based material, and independently has a dielectric constant (k) ranging from 2.5 to 4.5.

In accordance with some embodiments of the present disclosure, the silicon carbon nitride-based material includes silicon elements in an atomic concentration ranging from 10% to 35%, carbon elements in an atomic concentration ranging from 20% to 50%, and nitride elements in an atomic concentration ranging from 20% to 40%.

In accordance with some embodiments of the present disclosure, the sustaining layer and the inter-metal dielectric layer are made of silicon carbon nitride-based materials different from each other. The sustaining layer has a dielectric constant (k) greater than that of the inter-metal dielectric layer.

In accordance with some embodiments of the present disclosure, the inter-metal dielectric layer has a thickness greater than that of the sustaining layer.

In accordance with some embodiments of the present disclosure, the method further includes forming a plurality of liner portions each of which is disposed between an inner surface of one of the recesses and a corresponding one of the electrically conductive portions, and each of which is made of a silicon carbon nitride-based material. Each of the liner portions has a dielectric constant (k) ranging from 2.5 to 4.5.

In accordance with some embodiments of the present disclosure, the silicon carbonitride-based material for forming the liner portions includes silicon elements in an atomic concentration ranging from 10% to 35%, carbon elements in an atomic concentration ranging from 20% to 50%, and nitride elements in an atomic concentration ranging from 20% to 40%.

In accordance with some embodiments of the present disclosure, the method further includes forming a plurality of capping layers respectively on the electrically conductive portions. The capping layer includes metal elements, graphene, silicon nitride, or combinations thereof.

In accordance with some embodiments of the present disclosure, the sacrificial layer is made of a polymer, and each of the sustaining layer and the inter-metal dielectric layer is formed at a temperature lower than a glass-transition temperature (Tg) of the polymer.

In accordance with some embodiments of the present disclosure, a method for manufacturing a semiconductor structure includes: forming a stack over a base structure including a substrate, the stack including a first sacrificial layer, a first inter-metal dielectric layer, and a first sustaining layer formed between the first sacrificial layer and the first inter-metal dielectric layer; patterning the stack to form a plurality of recesses which expose the base structure such that the first sacrificial layer, the first sustaining layer, and the first inter-metal dielectric layer are respectively patterned into a first sacrificial feature, a first sustaining feature, and a first inter-metal dielectric feature; forming a plurality of electrically conductive portions respectively in the recesses; and removing the first sacrificial feature to form a first air gap layer between two adjacent ones of the electrically conductive portions.

In accordance with some embodiments of the present disclosure, the first sacrificial layer and the first inter-metal dielectric layer are respectively proximate to and distal from the substrate.

In accordance with some embodiments of the present disclosure, the first sacrificial layer and the first inter-metal dielectric layer are respectively distal from and proximate to the substrate.

In accordance with some embodiments of the present disclosure, the stack further includes a second sustaining layer and a second inter-metal dielectric layer which are formed on the first sacrificial layer opposite to the first sustaining layer, and which are respectively proximate to and distal from the first sustaining layer. After patterning the stack, the second sustaining layer and the second inter-metal dielectric layer are respectively patterned into a second sustaining feature and a second inter-metal dielectric feature.

In accordance with some embodiments of the present disclosure, the stack further includes a second sustaining layer and a second sacrificial layer which are formed on the first sacrificial layer opposite to the first sustaining layer, and which are respectively proximate to and distal from the first sustaining layer. After patterning the stack, the second sustaining layer and the second sacrificial layer are respectively patterned into a second sustaining feature and a second sacrificial feature. Each of the recesses has a first recess portion in the first inter-metal dielectric feature and the first sustaining feature, and a second recess portion in the first sacrificial feature, the second sustaining feature and the second sacrificial feature. The second recess portion has a dimension larger than that of the first recess portion. The method further includes removing the second sacrificial feature to form a second air gap layer.

In accordance with some embodiments of the present disclosure, a semiconductor structure includes a base structure, a plurality of electrically conductive features disposed on the base structure, and an isolation structure disposed on the base structure. The base structure includes a substrate. The electrically conductive features are spaced apart from each other. The isolation structure includes a first inter-metal dielectric feature extending horizontally to interconnect the electrically conductive features, a first air gap layer disposed in the isolation structure and around the electrically conductive features, and a first sustaining feature extending horizontally to interconnect the electrically conductive features and disposed between the first inter-metal dielectric feature and the first air gap layer.

In accordance with some embodiments of the present disclosure, the first air gap layer and the first inter-metal dielectric feature are respectively proximate to and distal from the substrate.

In accordance with some embodiments of the present disclosure, the first air gap layer and the first inter-metal dielectric feature are respectively distal from and proximate to the substrate.

In accordance with some embodiments of the present disclosure, the isolation structure further includes a second sustaining feature and a second inter-metal dielectric feature which are disposed on the first air gap layer opposite to the first sustaining feature, and which are respectively proximate to and distal from the first sustaining feature. Each of the second sustaining feature and the second inter-metal dielectric feature extends horizontally to interconnect the electrically conductive features. The second sustaining feature is disposed between the second inter-metal dielectric feature and the first air gap layer.

In accordance with some embodiments of the present disclosure, the semiconductor structure further includes an etch stop layer disposed on the isolation structure to cover the electrically conductive features.

In accordance with some embodiments of the present disclosure, the isolation structure further includes a second sustaining feature and a second air gap layer which are disposed on the first air gap layer opposite to the first sustaining feature, and which are respectively proximate to and distal from the first sustaining feature. The second sustaining feature extends horizontally to interconnect the electrically conductive features, and is disposed between the first and second air gap layers. The second air gap layer is disposed between the second sustaining feature and the etch stop layer and around the electrically conductive features.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a stack over a substrate, the stack including a sacrificial layer, an inter-metal dielectric layer, and a sustaining layer formed between the sacrificial layer and the inter-metal dielectric layer;
   patterning the stack to form recesses spaced apart from each other, each of the recesses penetrating through the stack such that the sacrificial layer, the sustaining layer and the inter-metal dielectric layer are respectively patterned into a sacrificial feature, a sustaining feature and an inter-metal dielectric feature;
   forming electrically conductive portions respectively in the recesses; and
   removing the sacrificial feature to form an air gap layer in the patterned stack.

2. The method of claim 1, wherein each of the sustaining layer and the inter-metal dielectric layer is made of a silicon carbon nitride-based material, and has a dielectric constant (k) ranging from 2.5 to 4.5.

3. The method of claim 2, wherein the silicon carbon nitride-based material includes
   silicon elements in an atomic concentration ranging from 10% to 35%,
   carbon elements in an atomic concentration ranging from 20% to 50%, and
   nitride elements in an atomic concentration ranging from 20% to 40%.

4. The method of claim 2, wherein the sustaining layer and the inter-metal dielectric layer are made of silicon carbon nitride-based materials different from each other, the sustaining layer having a dielectric constant (k) greater than that of the inter-metal dielectric layer.

5. The method of claim 4, wherein the inter-metal dielectric layer has a thickness greater than that of the sustaining layer.

6. The method of claim 1, further comprising
   forming liner portions each of which is disposed between an inner surface of one of the recesses and a corresponding one of the electrically conductive portions, and each of which is made of a silicon carbon nitride-based material, each of the liner portions having a dielectric constant (k) ranging from 2.5 to 4.5.

7. The method of claim 6, wherein the silicon carbon nitride-based material for forming the liner portions includes
   silicon elements in an atomic concentration ranging from 10% to 35%,
   carbon elements in an atomic concentration ranging from 20% to 50%, and
   nitride elements in an atomic concentration ranging from 20% to 40%.

8. The method of claim 1, further comprising:
   forming capping layers respectively on the electrically conductive portions, the capping layer including metal elements, graphene, silicon nitride, or combinations thereof.

9. The method of claim 1, wherein the sacrificial layer is made of a polymer, and each of the sustaining layer and the inter-metal dielectric layer is formed at a temperature lower than a glass-transition temperature (Tg) of the polymer.

10. A method for manufacturing a semiconductor structure, comprising:
    forming a stack over a base structure including a substrate, the stack including a first sacrificial layer, a first inter-metal dielectric layer, and a first sustaining layer formed between the first sacrificial layer and the first inter-metal dielectric layer;
    patterning the stack to form recesses which expose the base structure such that the first sacrificial layer, the first sustaining layer, and the first inter-metal dielectric layer are respectively patterned into a first sacrificial feature, a first sustaining feature, and a first inter-metal dielectric feature;
    forming electrically conductive portions respectively in the recesses; and
    removing the first sacrificial feature to form a first air gap layer between two adjacent ones of the electrically conductive portions.

11. The method of claim 10, wherein the first sacrificial layer and the first inter-metal dielectric layer are respectively proximate to and distal from the substrate.

12. The method of claim 10, wherein the first sacrificial layer and the first inter-metal dielectric layer are respectively distal from and proximate to the substrate.

13. The method of claim 12, wherein:
    the stack further includes a second sustaining layer and a second inter-metal dielectric layer which are formed on the first sacrificial layer opposite to the first sustaining layer, and which are respectively proximate to and distal from the first sustaining layer; and
    after patterning the stack, the second sustaining layer and the second inter-metal dielectric layer are respectively patterned into a second sustaining feature and a second inter-metal dielectric feature.

14. The method of claim 12, wherein:
    the stack further includes a second sustaining layer and a second sacrificial layer which are formed on the first sacrificial layer opposite to the first sustaining layer, and which are respectively proximate to and distal from the first sustaining layer;
    after patterning the stack, the second sustaining layer and the second sacrificial layer are respectively patterned into a second sustaining feature and a second sacrificial feature;
    each of the recesses has a first recess portion located in the first inter-metal dielectric feature and the first sustaining feature, and a second recess portion located in the first sacrificial feature, the second sustaining feature and the second sacrificial feature, the second recess portion having a dimension larger than that of the first recess portion; and
    the method further comprises removing the second sacrificial feature to form a second air gap layer.

15. A method for manufacturing a semiconductor structure comprising:
   forming a base structure, the base structure including a substrate;
   forming electrically conductive features on the base structure, the electrically conductive features being spaced apart from each other; and
   forming an isolation structure on the base structure, the isolation structure including
      a first inter-metal dielectric feature extending horizontally to interconnect the electrically conductive features,
      a first air gap layer formed in the isolation structure and around the electrically conductive features, and
      a first sustaining feature extending horizontally to interconnect the electrically conductive features and being formed between the first inter-metal dielectric feature and the first air gap layer.

16. The method of claim 15, wherein the first air gap layer and the first inter-metal dielectric feature are respectively proximate to and distal from the substrate.

17. The method of claim 15, wherein the first air gap layer and the first inter-metal dielectric feature are respectively distal from and proximate to the substrate.

18. The method of claim 17, wherein:
   the isolation structure further includes a second sustaining feature and a second inter-metal dielectric feature which are formed on the first air gap layer opposite to the first sustaining feature, the second sustaining feature and the second inter-metal dielectric feature being respectively proximate to and distal from the first sustaining feature;
   each of the second sustaining feature and the second inter-metal dielectric feature extends horizontally to interconnect the electrically conductive features; and
   the second sustaining feature is formed between the second inter-metal dielectric feature and the first air gap layer.

19. The method of claim 17, wherein:
   the isolation structure further includes a second sustaining feature and a second air gap layer which are formed on the first air gap layer opposite to the first sustaining feature, the second sustaining feature and the second air gap layer being respectively proximate to and distal from the first sustaining feature;
   the second sustaining feature extends horizontally to interconnect the electrically conductive features, and is formed between the first and second air gap layers; and
   the second air gap layer is formed around the electrically conductive features.

20. The method of claim 19, further comprising:
   forming an etch stop layer on the isolation structure to cover the electrically conductive features, such that the second air gap layer is disposed between the second sustaining feature and the etch stop layer.

* * * * *